US012310116B2

(12) United States Patent
Simsek-Ege

(10) Patent No.: US 12,310,116 B2
(45) Date of Patent: May 20, 2025

(54) TRANSISTOR CONFIGURATIONS FOR MULTI-DECK MEMORY DEVICES

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 18/542,240

(22) Filed: Dec. 15, 2023

(65) Prior Publication Data

US 2024/0194671 A1  Jun. 13, 2024

Related U.S. Application Data

(62) Division of application No. 17/326,286, filed on May 20, 2021, now Pat. No. 11,862,628.

(51) Int. Cl.
*H10D 88/00* (2025.01)
*G11C 5/06* (2006.01)
(Continued)

(52) U.S. Cl.
CPC ............ *H10D 88/00* (2025.01); *G11C 5/06* (2013.01); *H01L 23/5384* (2013.01); *H01L 23/5386* (2013.01); *H01L 25/0657* (2013.01); *H10D 84/0165* (2025.01); *H10D 84/038* (2025.01); *H10D 84/85* (2025.01)

(58) Field of Classification Search
CPC .............. H01L 21/8238; H01L 23/5384; H01L 23/5386; H01L 25/0657; H01L 27/0688; H01L 21/8221; H10B 53/20; H10D 88/00; G11C 5/06; G11C 5/025
See application file for complete search history.

(56) References Cited

U.S. PATENT DOCUMENTS 10,636,813 B1   4/2020  Xiao
10,879,260 B2  12/2020  Uryu et al.
(Continued)

FOREIGN PATENT DOCUMENTS

WO   2021/087763 A1   5/2021

OTHER PUBLICATIONS

"International Search Report and Written Opinion of the International Searching Authority," issued in connection with Int'l Appl. No. PCT/US2022/072127 dated Aug. 19, 2022 (9 pages).

*Primary Examiner* — Bac H Au
(74) *Attorney, Agent, or Firm* — Holland & Hart LLP

(57) ABSTRACT

Methods, systems, and devices for transistor configurations for multi-deck memory devices are described. A memory device may include a first set of transistors formed in part by doping portions of a first semiconductor substrate of the memory device. The memory device may include a set of memory cells arranged in a stack of decks of memory cells above the first semiconductor substrate and a second semiconductor substrate bonded above the stack of decks. The memory device may include a second set of transistors formed in part by doping portions of the second semiconductor substrate. The stack of decks may include a lower set of one or more decks that is coupled with the first set of transistors and an upper set of one or more decks that is coupled with the second set of transistors.

14 Claims, 10 Drawing Sheets

(51) Int. Cl.
*H01L 23/538* (2006.01)
*H01L 25/065* (2023.01)
*H10D 84/01* (2025.01)
*H10D 84/03* (2025.01)
*H10D 84/85* (2025.01)

(56) References Cited

U.S. PATENT DOCUMENTS

| | | |
|---|---|---|
| 11,056,454 B2 | 7/2021 | Liu |
| 11,551,753 B2 | 1/2023 | Liu |
| 2012/0003808 A1 | 1/2012 | Lee |
| 2012/0091587 A1* | 4/2012 | Or-Bach ............... H01L 21/845 |
| | | 257/E23.145 |
| 2017/0236746 A1 | 8/2017 | Yu et al. |
| 2018/0040377 A1 | 2/2018 | Sakui |
| 2019/0043836 A1 | 2/2019 | Fastow et al. |
| 2019/0074222 A1* | 3/2019 | Or-Bach ............... H10B 12/50 |
| 2020/0098748 A1 | 3/2020 | Xiao et al. |
| 2020/0194452 A1 | 6/2020 | Xiao |
| 2020/0350320 A1 | 11/2020 | Cheng et al. |
| 2021/0151413 A1 | 5/2021 | Liu |
| 2022/0359441 A1 | 11/2022 | Hasnat et al. |

* cited by examiner

TRANSISTOR CONFIGURATIONS FOR MULTI-DECK MEMORY DEVICES

CROSS REFERENCE

The present application for patent is a divisional of U.S. patent application Ser. No. 17/326,286 by Simsek-Ege, entitled "TRANSISTOR CONFIGURATIONS FOR MULTI-DECK MEMORY DEVICES," filed May 20, 2021, assigned to the assignee hereof, and is expressly incorporated by reference in its entirety herein.

FIELD OF TECHNOLOGY

The following relates generally to a system that includes at least one memory device and more specifically to transistor configurations for multi-deck memory devices.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
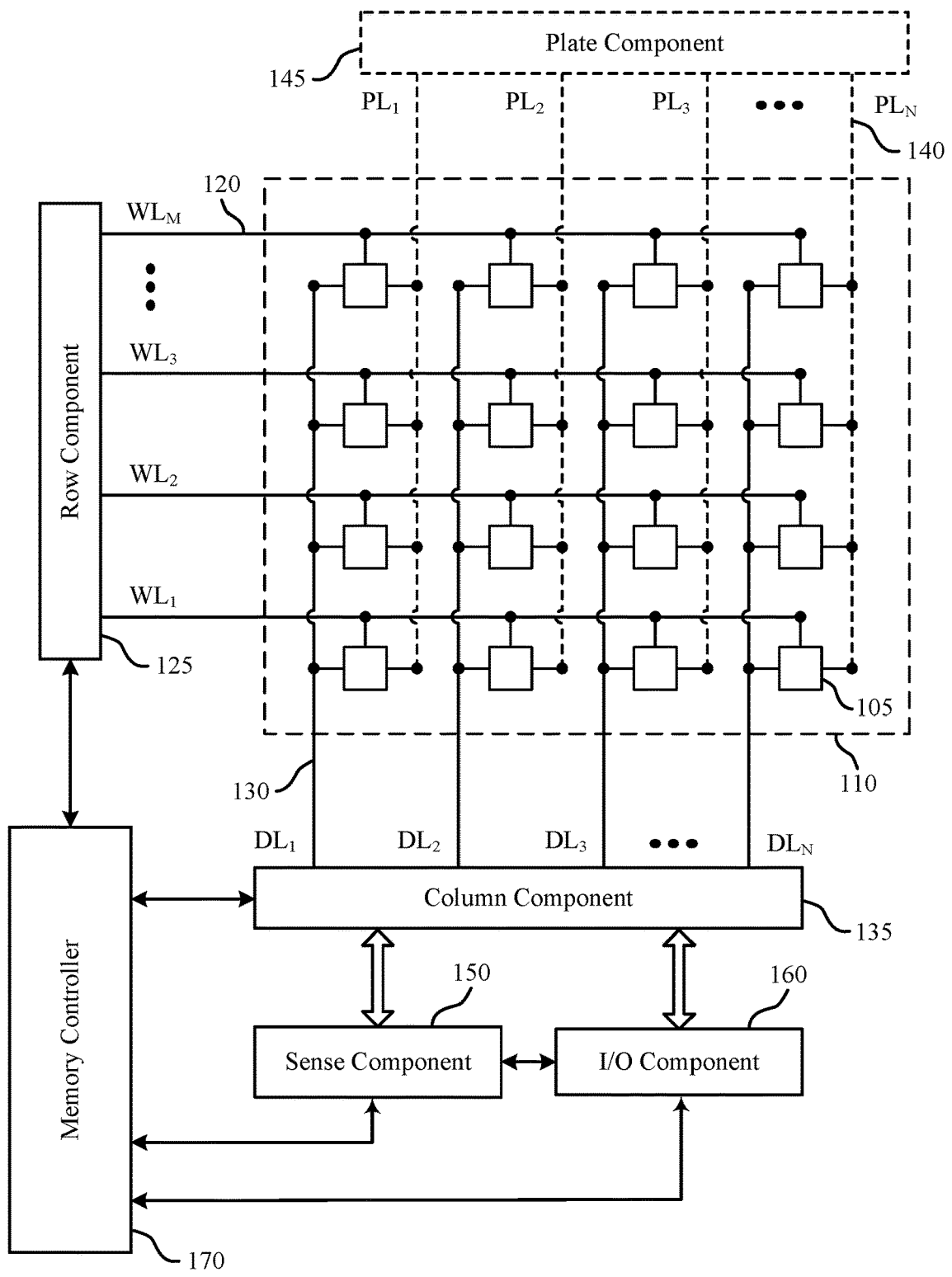
FIG. 1 illustrates an example of a memory device that supports transistor configurations for multi-deck memory devices in accordance with examples as disclosed herein.

Memory devices may include various arrangements of memory arrays and supporting circuitry formed over a substrate. For example, a memory device may include one or more decks of one or more memory arrays over a substrate, where a deck may refer to a plane or level of memory cells (e.g., of a memory array) above and parallel to the substrate. In some examples, substrate-based circuitry that supports accessing or operating the memory arrays may be located below the memory arrays, which may refer to a location that is at least in part between the memory arrays and the substrate (e.g., in a vertical direction). For example, sensing circuitry, decoding circuitry, periphery circuitry, or other logic and circuitry may be located below the memory arrays but above the substrate and, in some examples, may include transistors that are formed at least in part by doping portions of the substrate (e.g., substrate-based transistors, transistors having channels formed from doped crystalline silicon or another semiconductor substrate). But as memory devices scale with a greater quantity of layers or decks of memory arrays above a substrate, the area of a substrate used for such substrate-based circuitry may increase, which may lead to various limitations (e.g., related to the limited area of a substrate to support a growing quantity of decks and, by extension, a growing quantity and area for such substrate-based circuitry, related to routing challenges associated with locating some circuitry below a stack of decks but not above the stack of decks).

In accordance with examples as disclosed herein, a memory device may include a stack of decks of memory cells and circuitry for accessing or operating the stack of decks (e.g., substrate-based circuitry, CMOS circuitry) with some being located above the stack of decks and some being located below the stack of decks. For example, the memory device may include lower substrate-based circuitry formed at least in part by doping portions of a lower semiconductor substrate (e.g., a first or base substrate, a silicon substrate, a crystalline semiconductor substrate) to form a first set of transistors. Above the lower substrate-based circuitry, the memory device may include a stack of decks of memory cells and an upper semiconductor substrate (e.g., a second or supplemental substrate) bonded above the stack of decks. The upper substrate-based circuitry may be formed at least in part by doping portions of the upper semiconductor substrate to form a second set of transistors. The stack of decks may include a lower set of one or more decks that is coupled with the lower substrate-based circuitry and an upper set of one or more decks that is coupled with the upper substrate-based circuitry.

A combination of lower substrate-based circuitry and upper substrate-based circuitry may support accessing or operating of the decks of memory cells in accordance with various techniques. In some examples, circuitry that is common to or shared by at least some if not each deck of the stack of decks (e.g., input/output circuitry, backend circuitry) may be coupled with lower substrate-based circuitry and upper substrate-based circuitry. Implementing substrate-based circuitry above and below a stack of decks of memory cells of a memory device may increase an area available for substrate-based circuitry compared to memory devices that include a single level of substrate-based circuitry, which may support leveraging substrate materials for a greater quantity of components or larger components, for circuitry such as sensing circuitry, decoding circuitry, or periphery circuitry, among other circuitry used for accessing or otherwise operating memory arrays of a memory device. In some examples, implementing such circuitry in multiple levels of substrate-based circuitry of a memory die may alleviate or mitigate area utilization challenges or routing challenges of a single substrate level, which may improve scaling in memory devices by supporting a greater quantity of decks for a given footprint, among other advantages.

Features of the disclosure are initially described in the context of a memory device and related circuitry as described with reference to FIGS. 1 and 2. Features of the disclosure are described in the context of a memory device layout and illustrative fabrication techniques with reference to FIGS. 3-8. These and other features of the disclosure are further illustrated by and described with reference to flowcharts that relate to transistor configurations for multi-deck memory devices as described with references to FIGS. 9 and 10.

FIG. 1 illustrates an example of a memory device 100 that supports transistor configurations for multi-deck memory devices in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In some examples, a memory cell 105 may include or otherwise be associated with a configurable material, which may be referred to as a material memory element, a material storage element, a material portion, and others. The configurable material may have one or more variable and configurable characteristics or properties (e.g., material states) that may represent different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold characteristics, or other properties that are detectable or distinguishable during a read operation to identify a logic state written to or stored by the configurable material.

In some cases, a configurable material of a memory cell 105 may be associated with a threshold voltage. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with one logic state or another. Accordingly, the magnitude of current, or other characteristic (e.g., thresholding behavior, resistance breakdown behavior, snapback behavior) associated with the current that results from applying a read voltage to the memory cell 105, may be used to determine a logic state written to or stored by memory cell 105.

In the example of memory device 100, each row of memory cells 105 may be coupled with one or more word lines 120 (e.g., $WL_1$ through $WL_M$), and each column of memory cells 105 may be coupled with one or more digit lines 130 (e.g., $DL_1$ through $DL_N$). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A target or selected memory cell 105 may be a memory cell 105 located at the intersection of an energized or otherwise selected word line 120 and an energized or otherwise selected digit line 130.

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node or terminal of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130. A digit line 130 may then be accessed to read from or write to the respective memory cell 105.

In some examples, memory cells 105 may also be coupled with one or more plate lines 140 (e.g., $PL_1$ through $PL_N$). In some examples, each of the plate lines 140 may be independently addressable (e.g., supporting individual selection or biasing). In some examples, the plurality of plate lines 140 may represent or be otherwise functionally equivalent with a common plate, or other common node (e.g., a plate node common to each of the memory cells 105 in the memory array 110). When a memory cell 105 employs a capacitor for storing a logic state, a digit line 130 may provide access to a first terminal or a first plate of the capacitor, and a plate line 140 may provide access to a second terminal or a second plate of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer).

Access operations such as reading, writing, rewriting, and refreshing may be performed on a memory cell 105 by activating or selecting a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled using a row component 125 (e.g., a row decoder), a column component 135 (e.g., a column decoder), or a plate component 145 (e.g., a plate decoder), or a combination thereof. For example, a row component 125 may receive a row address from the memory controller 170 and activate the appropriate word line 120 based on the received row address. Similarly, a column component 135 may receive a column address from the memory controller 170 and activate the appropriate digit line 130. In some examples, such access operations may be accompanied by a plate component 145 biasing one or more of the plate lines 140 (e.g., biasing one of the plate lines 140, biasing some or all of the plate lines 140, biasing a common plate).

In some examples, the memory controller 170 may control operations (e.g., read operations, write operations, rewrite operations, refresh operations) of memory cells 105 using one or more components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the I/O component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of digit lines 130 connected to the sense component 150. For example, a sense component 150 may include a separate sensing circuit (e.g., a separate or duplicated sense amplifier, a separate or duplicated signal development component) for each of a set of digit lines 130 coupled with the sense component 150, such that a logic state may be separately detected for a respective memory cell 105 coupled with a respective one of the set of digit lines 130.

A memory cell 105 may be set, or written, by activating the relevant word line 120, digit line 130, or plate line 140 (e.g., via a memory controller 170). In other words, a logic state may be stored in a memory cell 105. A row component 125, a column component 135, or a plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude sufficient to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of a material memory architecture, a memory cell 105 may be written by applying a current, voltage, or other heating or biasing to a material memory element to configure the material according to a corresponding logic state.

In some examples, the memory device 100 may include multiple memory arrays 110 arranged in a stack of decks or levels relative to a substrate of the memory device 100 (e.g., a semiconductor substrate, a crystalline silicon substrate, a crystalline semiconductor substrate, a portion of a semiconductor wafer). In some cases, circuitry that supports accessing or operating the multiple memory arrays 110 (e.g., substrate-based circuitry, CMOS circuitry) may be located below the memory arrays 110, which may refer to a location that is at least in part between the memory arrays 110 and the substrate. For example, one or more row components 125, one or more column components 135, one or more plate components 145, one or more sense components 150, or one or more I/O components 160, or any combination thereof, may be located below the memory arrays 110 and above the substrate and, in some examples, may include transistors that are formed at least in part by doping portions of the substrate (e.g., substrate-based transistors, transistors having channels formed from doped crystalline silicon or other semiconductor). When scaling the memory device 100 with a greater quantity of decks or levels of memory arrays 110, the area of a substrate used for supporting circuitry may increase, which may lead to scaling limitations (e.g., related to the limited area of a substrate to support circuitry for accessing a growing quantity of decks or levels of memory arrays 110 and, by extension, a growing quantity and area for such decoders or other supporting circuitry, related to routing challenges associated with locating certain circuitry below a stack of decks but not above the stack of decks), among other challenges.

In accordance with examples as disclosed herein, the memory device 100 may include multiple memory arrays 110 arranged in a stack of decks formed above a substrate (e.g., a first substrate, a lower substrate), and substrate-based circuitry formed both above and below the stack of decks to support accessing or operating the memory arrays 110. For example, the memory device 100 may include lower substrate-based circuitry formed in part by doping portions of a lower substrate to form a first (e.g., lower) set of transistors. Above the lower substrate-based circuitry, the memory device 100 may include the stack of decks and an upper substrate bonded above the stack of decks. Upper substrate-based circuitry may be formed at least in part by doping portions of the upper substrate to form a second (e.g., upper) set of transistors. The stack of decks may include a lower set of one or more decks that are coupled with the lower substrate-based circuitry and an upper set of one or more decks that are coupled with the upper substrate-based circuitry.

A combination of lower substrate-based circuitry and upper substrate-based circuitry may support accessing or operating of the decks of memory cells in accordance with various techniques. For example, circuitry associated with a row component 125, a column component 135, a plate component 145, or a sense component 150, among other components or circuitry, may be divided between or distributed among lower substrate-based circuitry and upper substrate-based circuit, including various allocations of circuitry associated with operating certain decks of a stack of decks of memory arrays 110. In some examples, circuitry that is common to or shared by each deck of the stack (e.g., one or more portions of an input/output component 160, or a memory controller 170, among other components or circuitry) may be coupled with lower substrate-based circuitry and upper substrate-based circuitry and, in some examples, may be formed above the upper substrate-based circuitry.

Implementing substrate-based circuitry (e.g., CMOS circuitry) above and below a stack of decks of memory arrays 110 may increase an area available for substrate-based circuitry compared to memory devices that include a single level of substrate-based circuitry. Such techniques may support the memory device 100 leveraging substrate materials (e.g., crystalline semiconductor materials) for a greater quantity of components, or larger components, for circuitry such as sensing circuitry, decoding circuitry, or periphery circuitry, among other circuitry used for accessing or otherwise operating memory arrays of a memory device. In some examples, implementing such circuitry in multiple levels of substrate-based circuitry of a memory die may alleviate or mitigate area utilization challenges or routing challenges of a single substrate level, which may improve scaling in memory devices by supporting a greater quantity of decks for a given footprint. Accordingly, utilizing multiple levels of substrate-based circuitry may enable a greater scaling of decks, or improved scaling of memory storage, among other advantages.

Figure 2:
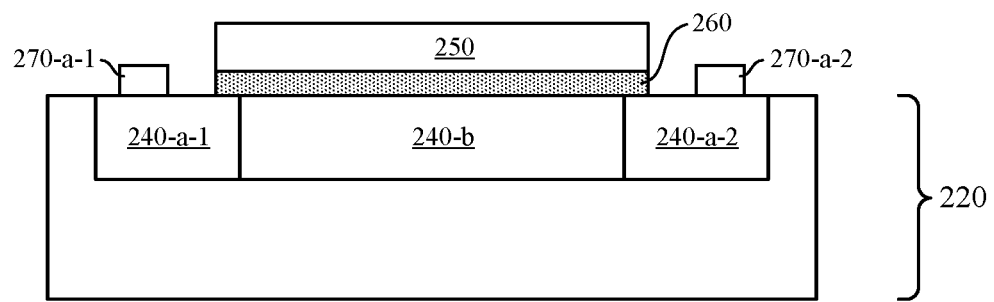
FIG. 2 illustrates an example of a transistor structure that supports transistor configurations for multi-deck memory devices in accordance with examples as disclosed herein.
Figure 2:
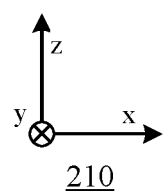

FIG. 2 illustrates an example of a transistor structure 200 that supports thin film transistor deck selection in a memory device in accordance with examples as disclosed herein. The transistor structure 200 illustrates an example of a transistor that is formed at least in part by portions of a substrate 220 (e.g., doped portions 240 of the substrate 220), and may illustrate an arrangement of features for a transistor that is configured in a planar transistor arrangement. The substrate 220 may be a portion of a semiconductor chip, such as a silicon chip of a memory die (e.g., crystalline silicon, monocrystalline silicon), among other examples of substrate material. For illustrative purposes, aspects of the transistor structure 200 may be described with reference to an x-direction, a y-direction, and a z-direction (e.g., a height direction) of a coordinate system 210. In some examples, the z-direction may be illustrative of a direction perpendicular to a surface of the substrate 220 (e.g., a surface in an xy-plane, a surface upon or over which other materials may be deposited), and each of the structures, illustrated by their respective cross section in an xz-plane, may extend for some distance (e.g., length) in the y-direction.

The transistor structure 200 illustrates an example of a transistor channel, electrically coupled between a terminal 270-$a$-1 and a terminal 270-$a$-2, that may include one or more doped portions 240 of the substrate 220. In various examples, one of the terminals 270-$a$-1 or 270-$a$-2 may be referred to as a source terminal, and the other of the terminals 270-$a$-1 or 270-$a$-2 may be referred to as a drain terminal, where such a designation may be based on a configuration or relative biasing of a circuit that includes the transistor structure 200. The channel (which may also be referred to as the channel portion) of a transistor may include or refer to one or more portions of the transistor structure that are operable to open or close a conductive path (e.g., to modulate a conductivity, to form a channel, to open a channel, to close a channel) between a source and drain (e.g., between the terminal 270-$a$-1 and the terminal 270-$a$-2) based at least in part on a voltage of a gate (e.g., a gate terminal, a gate portion 250). In other words, a channel portion of a transistor structure may be configured to be activated, deactivated, made conductive, or made non-conductive, based at least in part on a voltage of a gate portion, such as gate portion 250. In some examples of transistor structure 200 (e.g., a planar transistor arrangement), the channel portion formed by one or more doped portions 240 of the substrate 220 may support a conductive path in a generally horizontal or in-plane direction (e.g., along the x-direction, within an xy-plane, in a direction within or parallel to a surface of the substrate 220).

In some examples, the gate portion 250 may be physically separated from the channel portion (e.g., separated from the substrate 220, separated from one or more of the doped portions 240) by a gate insulation portion 260 (e.g., a gate dielectric). Each of the terminals 270 may be in contact with or otherwise coupled with (e.g., electrically, physically) a respective doped portion 240-$a$, and each of the terminals 270 and the gate portion 250 may be formed from an electrically conductive material such as a metal or metal alloy, or a polycrystalline semiconductor (e.g., polysilicon).

In some examples, the transistor structure 200 may be operable as an n-type or n-channel transistor, where applying a relatively positive voltage to the gate portion 250 that is above a threshold voltage (e.g., an applied voltage having a positive magnitude, relative to a source terminal, that is greater than a threshold voltage) activates the channel portion or otherwise enables a conductive path between the terminals 270-$a$-1 and 270-$a$-2 (e.g., along a direction generally aligned with the x-direction within the substrate 220). In such examples, the doped portions 240-a may refer to portions having n-type doping or n-type semiconductor, and doped portion 240-b may refer to portions having p-type doping or p-type semiconductor (e.g., a channel portion having an NPN configuration along the x-direction or channel direction).

In some examples, the transistor structure 200 may be operable as a p-type or p-channel transistor, where applying a relatively negative voltage to the gate portion 250 that is above a threshold voltage (e.g., an applied voltage having a negative magnitude, relative to a source terminal, that is greater than a threshold voltage) activates the channel portion or otherwise enables a conductive path between the terminals 270-a-1 and 270-a-2. In such examples, the doped portions 240-a may refer to portions having p-type doping or p-type semiconductor, and doped portion 240-b may refer to portions having n-type doping or n-type semiconductor (e.g., a channel portion having a PNP configuration along the x-direction or channel direction).

In some examples, circuitry operable to support access operations on memory cells 105 (e.g., a row component 125, a column component 135, a plate component 145, a sense component 150, a memory controller 170, or various combinations thereof) may be formed from respective sets of transistors each having the arrangement of the transistor structure 200, where each of the transistors may have a channel portion formed by respective doped portions 240 of a substrate 220. In some examples, such transistors may leverage a crystalline semiconductor material of the substrate 220, or another form of semiconductor material, for various performance characteristics or manufacturing characteristics of such a material or an arrangement. Some examples of such an arrangement may be implemented in a complementary metal-oxide-semiconductor (CMOS) configuration, which may refer to various examples of a complementary and symmetrical pair of a p-type transistor and an n-type transistor (e.g., for logic functions). However, such structures or arrangements of substrate-based transistors may be limited by an available area of the substrate 220 (e.g., under a memory array 110 or stack of levels or decks of memory arrays 110).

In accordance with examples as disclosed herein, a memory device 100 may include multiple levels of circuitry formed using multiple substrates 220. For example, the memory device 100 may include a first substrate 220 below a stack of decks of memory arrays 110 and a second substrate 220 above the stack of decks. Circuitry operable to support access operations on the stack of decks may include a first set of transistors formed at least in part by doped portions of the first substrate 220 and a second set of transistors formed at least in part by doped portions of the second substrate 220, where transistors of the first set and second set may include the arrangement of the transistor structure 200. In some examples, the first set of transistors, or the second set of transistors, or both may include transistors arranged in a CMOS configuration (e.g., in examples of a memory device 100 including CMOS circuitry located above and below a stack of memory arrays 110 for accessing the stack of memory arrays 110).

Figure 3:
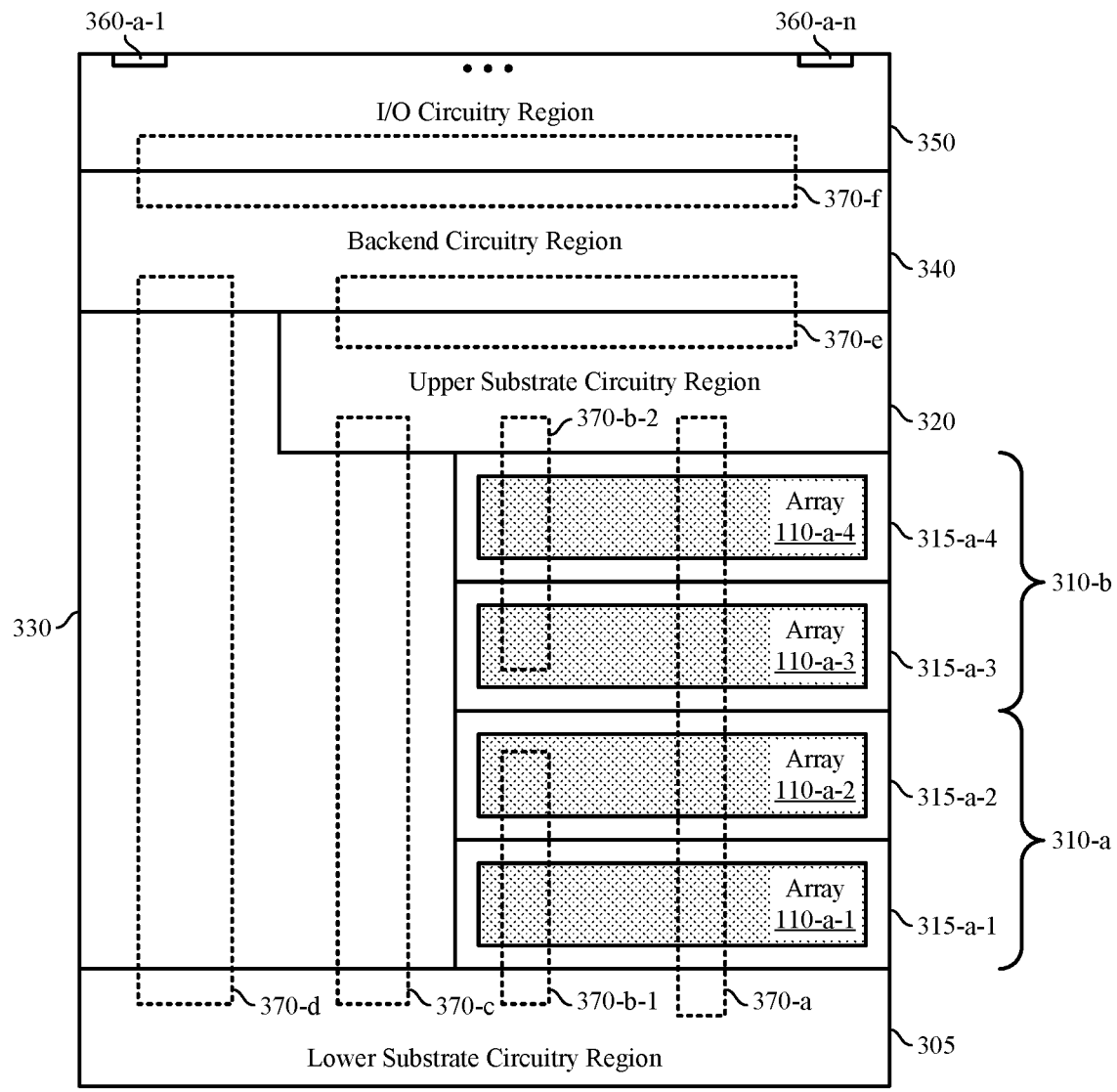
FIG. 3 illustrates a layout of a memory device that supports transistor configurations for multi-deck memory devices in accordance with examples as disclosed herein.
Figure 3:
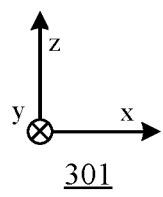

FIG. 3 illustrates a layout of a memory device 100-a that supports transistor configurations for multi-deck memory devices in accordance with examples as disclosed herein. The memory device 100-a may be an example of a memory device 100 described with reference to FIG. 1, and may include multiple levels of substrate-based circuitry (e.g., CMOS circuitry) for accessing and operating multiple decks or levels of memory arrays 110-a. For illustrative purposes, aspects of the memory device 100-a may be described with reference to an x-direction, a y-direction, and a z-direction of a coordinate system 301. In some examples, the z-direction may be illustrative of a direction perpendicular to a surface of a substrate 220 (e.g., a surface in an xy-plane, a surface upon or over which other materials may be deposited), and each of the related regions, illustrated by their respective cross-section in an xz-plane, may extend for some distance along the y-direction. In some examples, the x-direction may be aligned with or referred to as a row direction (e.g., along a row of memory cells 105), and the y-direction may be aligned with or referred to as a column direction (e.g., along a column of memory cells 105), or vice versa.

Each of the illustrative regions of the memory device 100-a may be associated with a region of components or circuitry that may be formed using various techniques. In some examples, functional components such as transistors in various configurations or arrangements within the illustrative regions may be interconnected by routing conductors (e.g., metal conductors) of the respective regions, which may include various arrangements of through-silicon vias (TSVs) or socket conductors that may be aligned along the z-direction, or various arrangements of in-plane conductors that may be aligned in one or more directions parallel to an xy-plane, or combinations thereof. Such interconnection may be associated with signal routing, or power or voltage distribution, among other functions.

The memory device 100-a may include a lower substrate circuitry region 305, which may include first (e.g., lower) substrate-based circuitry (e.g., first CMOS circuitry). The first substrate-based circuitry may include transistors formed at least in part by doping portions of a lower substrate 220 of the memory device 100-a (e.g., a semiconductor substrate, a crystalline silicon substrate, a crystalline semiconductor substrate, a portion of a semiconductor wafer). A substrate 220 of the lower substrate circuitry region 305 may be a base or initial substrate 220 of the memory device 100-a, upon which other components or circuitry are formed, and over which another substrate 220 may be added (e.g., bonded). In some examples, transistors of the lower substrate circuitry region 305 may include transistors formed or configured in accordance with the transistor structure 200, including such transistors in a CMOS arrangement.

Above the lower substrate circuitry region 305, the memory device 100-a may include a stack of decks 315-a, where each deck 315-a may be located at a different position along the z-direction. The memory device 100-a illustrates an example that includes four decks 315-a (e.g., decks 315-a-1 through 315-a-4), but a memory device 100 in accordance with examples as disclosed herein may include any quantity of two or more decks 315. Each deck 315-a may include a respective memory array 110-a, which may include a plurality of memory cells 105 that are distributed in an xy-plane. In some examples, memory cells 105 of a memory array 110-a may be arranged in rows that are aligned along the x-direction and columns that are aligned along the y-direction. Each of the memory arrays 110-a may include respective word lines 120 (e.g., along the x-direction), digit lines 130 (e.g., along the y-direction), and plate lines 140 (e.g., where applicable) for accessing the respective memory cells 105, among other circuitry.

The memory arrays 110-a of the memory device 100-a may include memory cells 105 in accordance with various memory architectures. In some examples, memory cells 105 of a memory array 110-a may each include a respective storage component (e.g., a capacitor) and a respective cell selection component (e.g., a cell selection transistor). In some examples (e.g., in an FeRAM application), capacitors of the memory cells 105 may be ferroelectric capacitors operable to store a charge or polarization corresponding to a logic state. A ferroelectric material used in a ferroelectric capacitor may be characterized by an electric polarization where the material maintains a non-zero electric charge in the absence of an electric field. In some examples, memory cells 105 of the memory arrays 110-a may include storage elements of different memory architectures, such as linear capacitors (e.g., in a DRAM application), transistors (e.g., in a NAND application, in an SRAM application), or material memory elements (e.g., in a RRAM application or a PCM application, which may include chalcogenide storage elements, resistive storage elements, thresholding storage elements), among other types of storage elements.

In some examples, the decks 315-a may include various transistors, such as cell selection transistors of or associated with the memory cells 105 of the respective memory arrays 110-a, among other examples. Transistors of the decks 315-a may be formed in accordance with various thin film manufacturing techniques, including deposition of polycrystalline semiconductor materials (e.g., polysilicon) over the lower substrate circuitry region 305. In some examples, transistors of the decks 315-a may include vertical transistors, which may support a respective channel formed at least in part along the z-direction.

Above the decks 315-a, the memory device 100-a may include an upper substrate circuitry region 320, which may include second (e.g., upper) substrate-based circuitry (e.g., second CMOS circuitry). The second substrate-based circuitry may include transistors formed at least in part by doping portions of an upper substrate 220 (e.g., a second substrate) of the memory device 100-a. A substrate 220 of the upper substrate circuitry region 320 may be a substrate 220 that is bonded or otherwise deposited over the decks 315-a, such as a second portion of crystalline semiconductor (e.g., a portion of a semiconductor wafer, a second portion of monocrystalline silicon). In some examples, transistors of the upper substrate circuitry region 320 may include transistors formed or configured in accordance with the transistor structure 200, including such transistors in a CMOS arrangement.

Above the upper substrate circuitry region 320, the memory device 100-a may include a backend circuitry region 340. The backend circuitry region 340 may include backend circuitry used to route signals for communication with a host device coupled to the memory device 100-a, among other signals. The backend circuitry region 340 may include various circuitry for communicating signals with both the upper substrate circuitry region 320 and the lower substrate circuitry region 305. In some examples, the backend circuitry may include metallic interconnects (e.g., copper interconnects).

Above the backend circuitry region 340, the memory device 100-a may include an I/O circuitry region 350. The I/O circuitry region 350 may include one or more pads 360-a (e.g., pads 360-a-1 through 360-a-n, conductive interfaces) that support various coupling or electronic communication between the memory device 100-a (e.g., the backend circuitry region 340) and a host device (e.g., for signaling associated with read or write commands, among other signaling). In some examples, the pads 360-a may be associated with signaling of one or more channels (e.g., data channels, control channels) for communicating information, commands, or diagnostic information between the memory device 100-a and a host device. In some examples, the pads 360-a may be configured for supplying power or voltages to various components of the memory device 100-a, among other purposes. Although the I/O circuitry region 350 and backend circuitry region 340 are illustrated as separate regions, in some examples, one or more aspects of an I/O circuitry region 350 and a backend circuitry region 340 may be combined in a single region (not shown), such as a single or combined region for interfacing between components of the memory device 100-a (e.g., the memory arrays 110-a) and a device or system outside the memory device 100-a.

In some examples, the memory device 100-a may include a backend interconnect region 330 above the lower substrate circuitry region 305, which may support interconnection between the lower substrate circuitry region 305 and the upper substrate circuitry region 320, or interconnection between the lower substrate circuitry region 305 and the backend circuitry region 340, or both.

The memory device 100-a may use circuitry of the lower substrate circuitry region 305 and the upper substrate circuitry region 320 to access and operate memory cells 105 of the memory arrays 110-a. In some examples, circuitry of the lower substrate circuitry region 305, or circuitry of the upper substrate circuitry region 320, or both may include circuitry for performing sense operations, circuitry for performing access operations, circuitry for performing decoding operations, or circuitry for performing I/O operations, or a combination thereof, among other operations. For example, circuitry of the lower substrate circuitry region 305, or circuitry of the upper substrate circuitry region 320, or both may include one or more portions of a row component 125, a column component 135, or a plate component 145, such as decoders, buffers, multiplexers, or drivers (e.g., word line drivers, sub-word line drivers, digit line drivers, sub-digit line drivers, plate line drivers, sub-plate line drivers, among other drivers), among other circuitry configured to address, decode, or bias access lines of one or more memory arrays 110-a of the memory device 100-a. Additionally or alternatively, circuitry of the lower substrate circuitry region 305, or circuitry of the upper substrate circuitry region 320, or both may include one or more portions of a sense component 150, such as one or more sense amplifiers, or one or more signal development components, among other circuitry for sensing or writing to memory cells 105 of the memory device 100-a.

In some examples, subsets of transistors of the lower substrate circuitry region 305, or of the upper substrate circuitry region 320, or both may be dedicated or allocated for a given purpose (e.g., function, operation). For example, sensing circuitry may include a subset of transistors that are configured to support sense operations, access circuitry (e.g., row access circuitry, column access circuitry, plate access circuitry) may include a subset of transistors that are configured to support activating or biasing access lines, decoding circuitry may include a subset of transistors that are configured to support decoding operations, I/O circuitry may include a subset of transistors that are configured to support I/O operations, and so on. That is, transistors of the lower substrate circuitry region 305, or of the upper substrate circuitry region 320, or both may be divided into various subsets of transistors that each support different operations and functions of the memory device 100-a.

In some examples, one or more portions of the lower substrate circuitry region 305 may be dedicated or allocated to supporting operation of some memory arrays 110-a of the memory device 100-a but not others, and one or more portions of the upper substrate circuitry region 320 may be dedicated or allocated to supporting operation of some memory arrays 110-*a* of the memory device 100-*a* but not others. For example, the decks 315-*a* may be divided into a first set 310-*a* (e.g., a lower set, including decks 315-*a*-1 and 315-*a*-2) and a second set 310-*b* (e.g., an upper set, including decks 315-*a*-3 and 315-*a*-4). In some examples, a division of the decks 315 into sets 310 may refer to how decks 315 are coupled to substrate-based circuitry of the memory device 100-*a*. For example, a set 310-*a* may refer to any quantity of decks 315-*a* that are coupled at least in part to lower substrate-based circuitry and a set 310-*b* may refer to any quantity of decks 315-*a* that are coupled at least in part to upper substrate-based circuitry. Although the example of memory device 100-*a* illustrates two sets 310 having a same quantity of decks 315-*a*, in some examples, a memory device 100 may include sets 310 having different quantities of decks 315.

The components and circuitry of the memory device 100-*a* may be coupled through various interconnection regions 370. Each of the interconnection regions 370 may illustrate portions of the memory device 100-*a* that support electrical coupling or interconnection along at least the z-direction between components or circuitry of the illustrated regions. For example, each interconnection region 370 may include various arrangements of TSVs or socket conductors that may be aligned along the z-direction. In some examples, the interconnection regions 370 may include various arrangements of in-plane conductors (e.g., in-plane routing between or among interconnections along the z-direction) that may be aligned in one or more directions parallel to an xy-plane, or combinations thereof.

The interconnection region 370-*a* may illustrate an example of a coupling between each of the memory arrays 110-*a* and the lower substrate circuitry region 305 and the upper substrate circuitry region 320. In some examples, the interconnection region 370-*a* may be an example of a word line socket region which may be used to select and activate one or more word lines of each of the decks 315-*a*, 315-*b*, 315-*c*, and 315-*d*. For example, the interconnection region 370-*a* may include interconnects that couple word lines of decks 315-*a*-1 through 315-*a*-4 to decoders (e.g., row components 125) and/or word line drivers (e.g., sub-word line drivers) included in the lower substrate circuitry region 305, in the upper substrate circuitry region 320, or both. Although the interconnection region 370-*a* illustrates coupling between the memory arrays 110-*a* and both the lower substrate circuitry region 305 and the upper substrate circuitry region 320, in some examples, an interconnection region 370-*a* may be implemented for coupling between the memory arrays 110-*a* and one of the lower substrate circuitry region 305 or the upper substrate circuitry region 320, but not both (e.g., in examples where CMOS or other circuitry of a row component 125, common to all of the memory arrays 110-*a*, is located in one of the lower substrate circuitry region 305 or the upper substrate circuitry region 320).

The interconnection regions 370-*b* may illustrate examples of a coupling between memory arrays 110-*a* of a set 310 and one of the lower substrate circuitry region 305 or the upper substrate circuitry region 320. In some examples, interconnection regions 370-*b* may be examples of a digit line socket region, which may be used to select and activate one or more digit lines of the decks 315-*a*. For example, the memory device 100-*a* may include an interconnection region 370-*b*-1 that couples digit lines of decks 315-*a*-1 and 315-*a*-2 of the set 310-*a* to decoders (e.g., column components 135), digit line drivers (sub-digit line drivers), sense amplifiers, or a combination thereof, of the lower substrate circuitry region 305. In some examples, the memory device 100-*a* may include an interconnection region 370-*b*-2 that includes interconnects that couple digit lines of decks 315-*a*-3 and 315-*a*-4 of the set 310-*b* to such circuitry of the upper substrate circuitry region 320.

The interconnection region 370-*c* may illustrate an example of a coupling between the lower substrate circuitry region 305 and the upper substrate circuitry region 320. For example, the upper substrate circuitry region 320 may include pad logic or other CMOS circuitry associated with functionality for all of decks 315-*a*-1 through 315-*a*-4, which may be coupled with decks 315-*a*-1 and 315-*a*-2 via the interconnection region 370-*c* and via the lower substrate circuitry region 305. Locating such pad logic or other shared CMOS circuitry in the upper substrate circuitry region 320 may provide favorable proximity to components or circuitry of the backend circuitry region 340, or may reduce area utilization of a lower substrate 220 of the lower substrate circuitry region 305 for favorable scaling or routing flexibility, or both, among other advantages.

The interconnection region 370-*d* may illustrate an example of a coupling between the lower substrate circuitry region 305 and the backend circuitry region 340, and the interconnection region 370-*e* may illustrate an example of an interconnection between the upper substrate circuitry region 320 and the backend circuitry region 340. The interconnection region 370-*f* may illustrate an example of a coupling between the backend circuitry region 340 and the I/O circuitry region 350.

By including both the lower substrate circuitry region 305 and the upper substrate circuitry region 320, the memory device 100-*a* may support a distribution of substrate-based circuitry or CMOS circuitry for accessing and operating a stack or multiple decks 315-*a* between two substrates, which may reduce the area or footprint of each substrate 220 that is occupied by such circuitry. A distribution of circuitry between such regions may enable greater scaling of the memory device 100-*a* (e.g., using a greater quantity of decks 315-*a*) within a given area or footprint. Moreover, in some examples, pad logic or other circuitry associated with both the lower set 310-*a* and the upper set 310-*b* may be included the upper substrate-based circuitry (e.g., rather than being distributed between the upper substrate-based circuitry and the lower substrate-based circuitry, or included entirely in the lower substrate-based circuitry), which may support allocating more of a lower substrate for other purposes, such as interconnect circuitry that supports an increased quantity of decks 315-*a*.

FIGS. 4 through 8 illustrate examples of operations for forming a memory device that supports transistor configurations for multi-deck memory devices in accordance with examples as disclosed herein. For example, FIGS. 4 through 8 may illustrate aspects of a sequence of operations that may support manufacturing a memory device 100-*a* to include multiple levels of substrate-based or CMOS circuitry. Each of the figures may be described with reference to an x-direction, a y-direction, and a z-direction of the coordinate system 301. Operations illustrated in and described with reference to FIGS. 4 through 8 may be performed by a manufacturing system, such as a semiconductor fabrication system configured to perform additive operations such as deposition or bonding, subtractive operations such as etching, trenching, planarizing, or polishing, and supporting operations such as masking, photolithography, or aligning, among other operations that support the described techniques.

Figure 4:
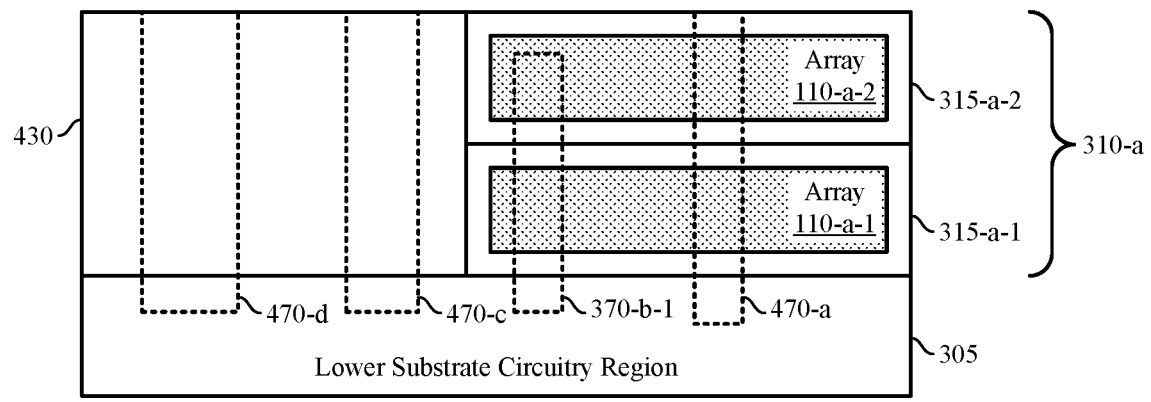
FIGS. 4 through 8 illustrate examples of operations for forming a memory device that supports transistor configurations for multi-deck memory devices in accordance with examples as disclosed herein.
Figure 4:

FIG. 4 illustrates a portion of the memory device 100-*a* after a first set of manufacturing operations, including the formation of the lower substrate circuitry region 305, the decks 315-*a*-1 and 315-*a*-2 of the set 310-*a*, and a portion 430 of the backend interconnect region 330.

Forming the lower substrate circuitry region 305 may include forming various circuitry for operating or accessing at least the decks 315-*a* of the set 310-*a*, which may include portions of a row component 125 (e.g., a row decoder, a word line driver), a column component 135 (e.g., a column decoder, a digit line driver), or a sense component 150 (e.g., sense amplifiers), among other components or circuitry. In some examples, forming the lower substrate circuitry region 305 may omit forming some components or circuitry for operating the decks 315-*a* of the set 310-*a* (e.g., I/O circuitry, pad logic), because such circuitry may be located elsewhere in the memory device 100-*a* (e.g., in the upper substrate circuitry region 320). Forming the lower substrate circuitry region 305 may include doping portions of a substrate 220 (e.g., a first substrate) to form a lower set of transistors, which may include forming transistor structures 200 described with reference to FIG. 2. In some examples, at least some of such transistors may be arranged in a CMOS configuration.

In some examples, the deck 315-*a*-1 may be formed over the lower substrate circuitry region 305, which may be followed by forming the deck 315-*a*-2 over the deck 315-*a*-1. In some examples, formation of the decks 315-*a*-1 and 315-*a*-2 may be accompanied by aspects of forming the portion 430 of the backend interconnect region 330. Forming the decks 315-*a* of the set 310-*a* may include various operations for forming the respective memory arrays 110-*a*, such as forming memory cells 105 (e.g., capacitors, transistors, material memory elements, or other storage elements that may be distributed in an xy-plane), word lines 120 (e.g., aligned along the x-direction), digit lines 130 (e.g., aligned along the y-direction), and plate lines 140 or other plate configurations (e.g., where applicable), among other components or circuitry of the respective memory array 110-*a*. In some examples, forming the decks 315-*a* may include forming transistors, such as cell selection transistors, among transistors for other purposes. Such transistors may be referred to as thin film transistors, and may include transistors having a vertical channel configuration (e.g., vertical transistors).

In some examples, forming vertical transistors of the decks 315-*a* may include forming doped semiconductor pillars that are aligned along the z-direction. For example, to support an n-type transistor, a pillar may include at least a p-type semiconductor portion, or may include a stack (e.g., along the z-direction) of an n-type semiconductor, a p-type semiconductor, and an n-type semiconductor (e.g., in an NPN arrangement along the z-direction), among other constituent materials or arrangements. To support a p-type transistor, a pillar may include at least an n-type semiconductor portion, or may include a stack (e.g., along the z-direction) of a p-type semiconductor, an n-type semiconductor, and a p-type semiconductor (e.g., in an PNP arrangement in the z-direction), among other constituent materials or arrangements.

Semiconductor pillars for transistors of the decks 315-*a* (e.g., TFTs), among other portions of the memory device 100-*a*, may be formed according to various techniques. In some examples, one or more layers or stacks of layers of doped semiconductor material (e.g., polycrystalline semiconductor) may be deposited in the respective deck 315-*a*, and portions of the deposited layers located between respective pillars (e.g., along the x-direction, along the y-direction) may be etched away or trenched to form the respective pillars. Additionally or alternatively, in some examples, holes or trenches may be etched through a material of the respective deck 315-*a* (e.g., along or through the z-direction, through a dielectric material, through a gate dielectric material) and material for the pillars (e.g., one or more doped semiconductor materials, one or more electrode materials) may be deposited in the etched holes or trenches.

Forming the lower substrate circuitry region 305, the decks 315-*a*-1 and 315-*a*-2 of the set 310-*a*, and the portion 430 of the backend interconnect region 330 may include forming interconnection regions 370, or portions 470 thereof, which may include various additive or subtractive operations performed during the formation of the lower substrate circuitry region 305, the decks 315-*a*-1 and 315-*a*-2, or the portion 430. For example, forming circuitry of the interconnection region 370-*b*-1 (e.g., a first digit line socket region) may include forming TSVs between digit lines of the memory arrays 110-*a*-1 and 110-*a*-2 and circuitry of the lower substrate circuitry region 305 (e.g., column decoders, sense amplifiers). Further, forming circuitry of the portion 470-*a* of the interconnection region 370-*a* (e.g., a word line socket region) may include forming TSVs between word lines 120 of the memory arrays 110-*a*-1 and 110-*a*-2 and circuitry of the lower substrate circuitry region 305, or for later coupling with circuitry of the upper substrate circuitry region 320, or both (e.g., row decoders). Forming circuitry of the portions 470-*c* and 470-*d* of the interconnection regions 370-*c* and 370-*d* may include forming TSVs in contact with circuitry of the lower substrate circuitry region 305, and may provide such functionality as power, voltage, or signal distribution between the lower substrate circuitry region 305 and the upper substrate circuitry region 320 or the backend circuitry region 340, respectively. In some examples, aspects of forming the interconnection region 370-*b*-1 and the portions 470-*a*, 470-*c*, and 470-*d* may include concurrent operations, including one or more additive or subtractive operations for forming TSVs in two or more such regions.

Figure 5:
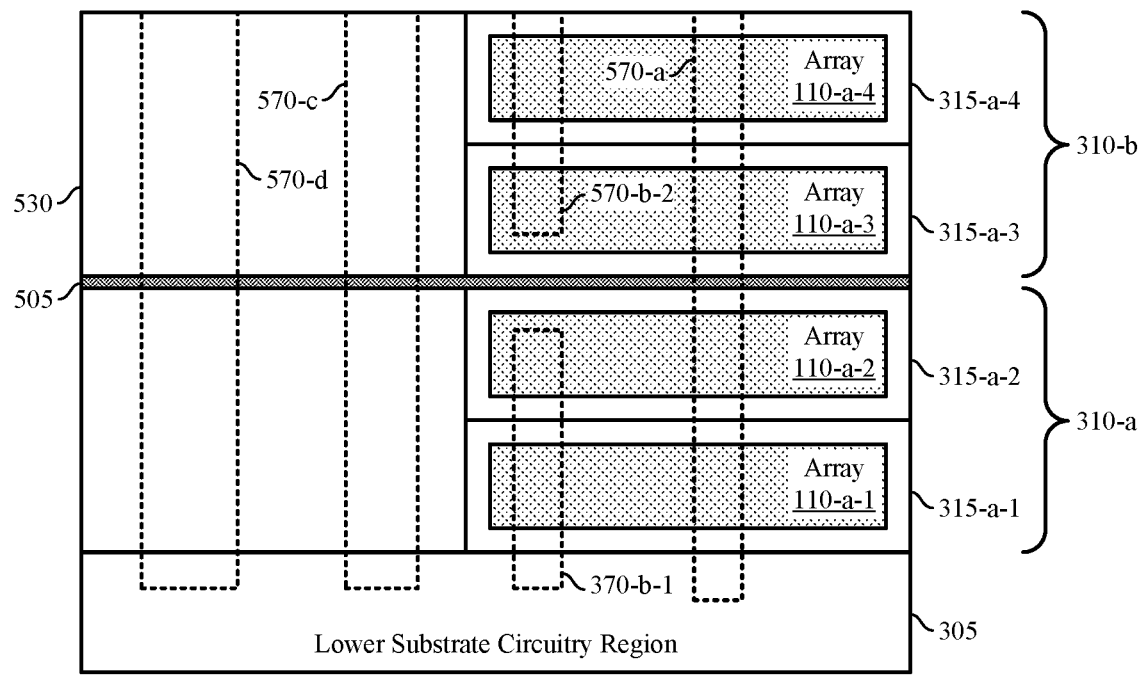
Figure 5:

FIG. 5 illustrates a portion of the memory device 100-*a* after a second set of manufacturing operations, including the formation of the decks 315-*a*-3 and 315-*a*-4 of the set 310-*b*, and a portion 530 of the backend interconnect region 330.

In some examples, the deck 315-*a*-3 may be formed over the deck 315-*a*-2, which may be followed by forming the deck 315-*a*-4 over the deck 315-*a*-3. In some examples, formation of the decks 315-*a*-3 and 315-*a*-4 may be accompanied by aspects of forming the portion 530 of the backend interconnect region 330. Forming the decks 315-*a* of the set 310-*b* may include various operations for forming the respective memory arrays 110-*a*, including operations described with reference to the formation of memory arrays 110-*a*-1 and 110-*a*-2.

Forming the decks 315-*a*-3 and 315-*a*-4 of the set 310-*b*, and the portion 530 of the backend interconnect region 330 may include forming interconnection regions 370, or portions 470 thereof, which may include various additive or subtractive operations performed during the formation of the decks 315-*a*-3 and 315-*a*-4 or the portion 530. For example, forming circuitry of the portion 570-*b*-2 of the interconnection region 370-*b*-2 (e.g., a second digit line socket region) may include forming TSVs for coupling between digit lines of the memory arrays 110-*a*-3 and 110-*a*-4 and circuitry of the upper substrate circuitry region 320 (e.g., column decoders, sense amplifiers, to be formed in later operations). Further, forming circuitry of the portion 570-*a* of the interconnection region 370-*a* (e.g., the word line socket region) may include forming TSVs between word lines 120 of the memory arrays 110-*a*-3 and 110-*a*-4 and circuitry of the lower substrate circuitry region 305 (e.g., via the portion 470-*a* formed in preceding operations), or for later coupling with circuitry of the upper substrate circuitry region 320, or both. Forming circuitry of the portions 570-*c* and 570-*d* of the interconnection regions 370-*c* and 370-*d* may include forming TSVs in contact with TSVs of the portion 430 formed in preceding operations.

In some examples, aspects of forming the portions 570-*a*, 570-*b*-2, 570-*c*, and 570-*d* may include concurrent operations, including one or more additive or subtractive operations for forming TSVs in two or more such regions. In some examples, prior to forming the deck 513-*a*-3 and the portion 530, a metal layer 505 may be formed above the deck 315-*a*-2 and the portion 430 of the backend interconnect region 330, which may provide in-plane conductors (e.g., in an xy-plane) for coupling between two or more of the interconnection regions 370-*a*, 370-*c*, or 370-*d*. In some examples, the metal layer 505 may provide further flexibility for routing power, voltage, or signaling between various components of the memory device 100-*a*. The metal layer 505 may be formed by depositing a metal over the set 310-*a* and the portion 430. In some cases, a mask may be used to deposit the metal layer 505 such that conductive portions are in contact with interconnects of the two or more of the portions 470-*a*, 470-*c*, or 470-*d*. In some examples, forming the metal layer 505 may include depositing a metal layer that is subsequently etched to form a set of portions of the metal layer 505 in contact with the interconnects of the two or more of the portions 470-*a*, 470-*c*, or 470-*d*. In some examples, the metal layer 505 may be omitted.

Figure 6A:
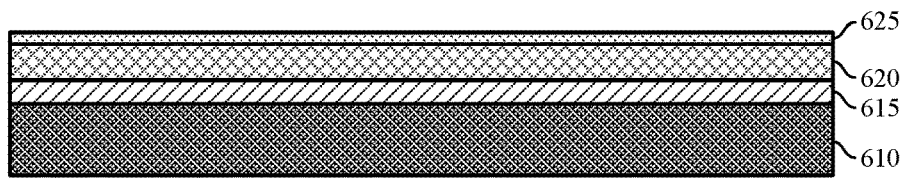
Figure 6B:
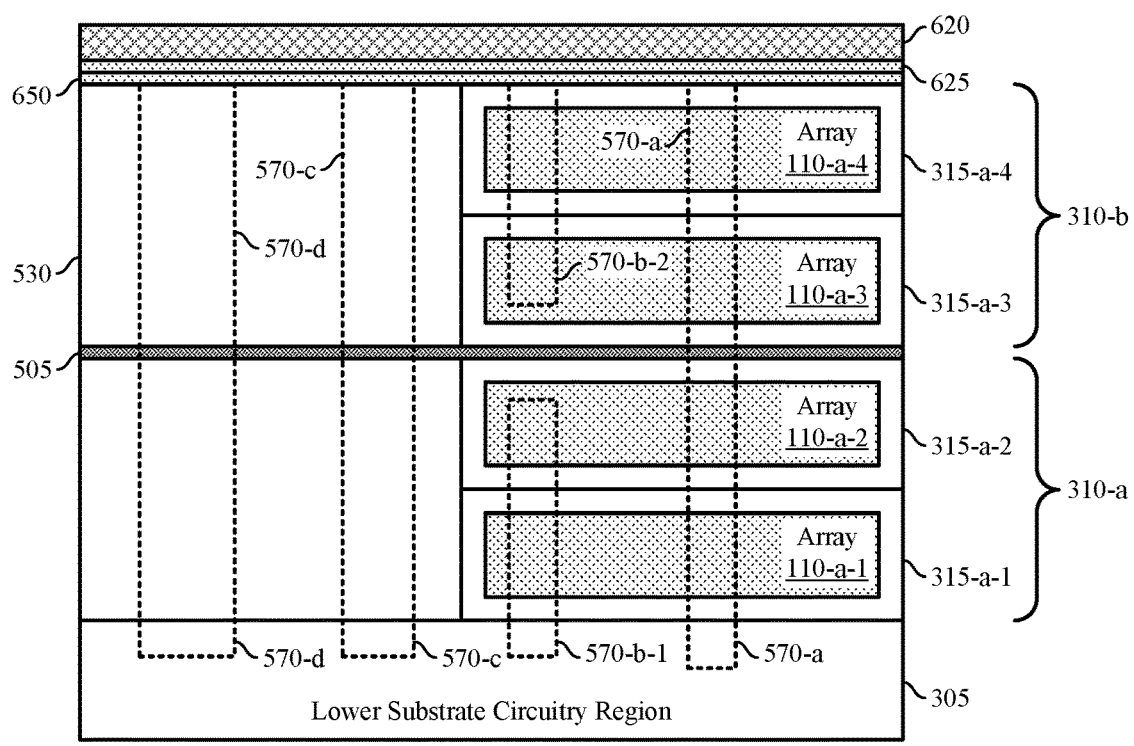
Figure 6B:
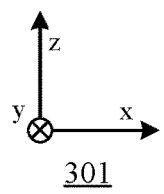

FIGS. 6A and 6B illustrates a portion of the memory device 100-*a* after a third set of manufacturing operations, including the bonding of an upper substrate (e.g., a second substrate 220).

FIG. 6A illustrates an example of a material stack 605 that may support an upper substrate in the memory device 100-*a*. The material stack 605 may include a donor wafer portion 610 and a silicon layer 620. In some examples, the material stack 605 may include an interface 615 between the donor wafer portion 610 and the silicon layer, which may provide a weakened portion between the donor wafer portion 610 and the silicon layer 620 that is leveraged for later processing. In some examples, the interface 615 may include a same material as the donor wafer portion 610 and the silicon layer 620 (e.g., a crystalline or monocrystalline silicon), which may be weakened by hydrogen ion implantation. In some examples, the material stack 605 may include an oxide layer 625, which may be leveraged to support various bonding techniques.

FIG. 6B illustrates an example of depositing a second substrate for the memory device 100-*a* that may be supported by the material stack 605. For example, the material stack 605 may be bonded to the manufactured portion of the memory device 100-*a*, which may include a bonding over or in contact with the top deck 315-*a* (e.g., deck 315-*a*-4) and the portion 530 of the backend interconnect region 330. In some examples, before such bonding, an oxide layer 650 may be formed over a top surface of the deck 315-*a*-4 and the portion 530, to which the oxide layer 625 of the material stack 605 may be bonded (e.g., after flipping the material stack 605). Thus, in some examples, the material stack may be bonded above the deck 315-*a*-4 and the portion 530 using an oxide-to-oxide bonding operation. After bonding the material stack 605, portions of the material stack 605 may be removed (e.g., along the z-direction, parallel to the xy-plane, including at least the donor wafer portion 610). For example, a top surface of the material stack 605 may be thinned by a buffing operation, a chemical mechanical planarization or polishing operation, among other operations that remove the donor wafer portion 610, or the donor wafer portion and the interface 615. Accordingly, an exposed top portion of the memory device 100-*a* after such operations may be a portion of the silicon layer 620 of the material stack 605, which may be an example of an upper substrate 220 with which upper substrate-base circuitry (e.g., CMOS circuitry) may be formed.

Although the example of FIGS. 6A and 6B illustrate an example for wafer-on-wafer oxide bonding, an upper substrate 220 may be formed or deposited in the memory device 100-*a* in accordance with other techniques. For example, some implementations may include various techniques for silicon-over-insulator or silicon layer transfer, where, in some examples, transistors leveraging such a substrate may be configured with polycrystalline semiconductor transistors with equivalent channel quality, or other performance characteristic, similar to transistors of the lower substrate circuitry region (e.g., transistors leveraging a monocrystalline semiconductor substrate).

Figure 7:
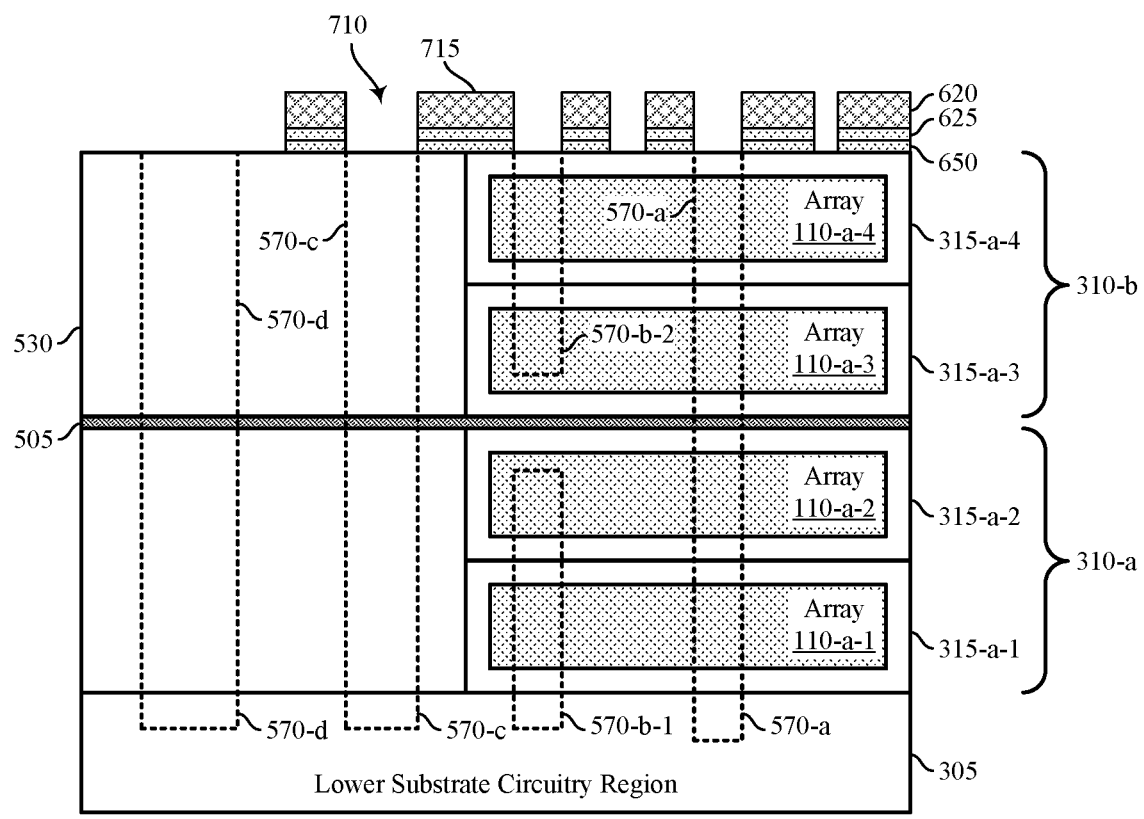
Figure 7:
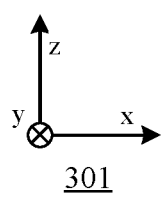

FIG. 7 illustrates a portion of the memory device 100-*a* after a fourth set of manufacturing operations, including the formation of the voids 710 through the silicon layer 620 and the oxide layers 625 and 650. The voids 710 may be formed by way of etching or other material removal operations through the respective layers, and may expose top surfaces of the top deck 315-*d* and the portion 530 between various substrate portions 715.

In some examples, the voids 710 may be aligned above the portions 570 of interconnection regions 370, which may support routing of power, voltage, or signal conductors through a level or height along the z-direction of the silicon layer 620. Accordingly, some voids may support routing interconnections with components or circuitry of the upper substrate circuitry region 320 (e.g., substrate-based transistors, transistors in a CMOS configuration). In some examples, a portion of the silicon layer 620 located outside the upper substrate circuitry region 320 may be etched or otherwise removed, including a portion that overlaps the backend interconnect region 330.

In some examples, the voids 710 may be aligned above features that support registration or alignment of subsequent operations of formation for the memory device 100-*a*, where such features may be dedicated for registration or alignment (e.g., fiducials), or may be operational or functional features of the top deck 315-*a*-1, or the portion 530, or both that support such alignment or registration. By supporting registration or alignment after the deposition of the silicon layer 620, subsequent operations may be performed with or over the silicon layer 620 with improved alignment (e.g., feature-to-feature alignment, relative to features of the memory device 100-*a* that have already been formed) compared to an alignment between features already formed on a material stack 605 and features of the memory device 100-*a* that are already formed (e.g., related to a bonding alignment accuracy).

Figure 8:
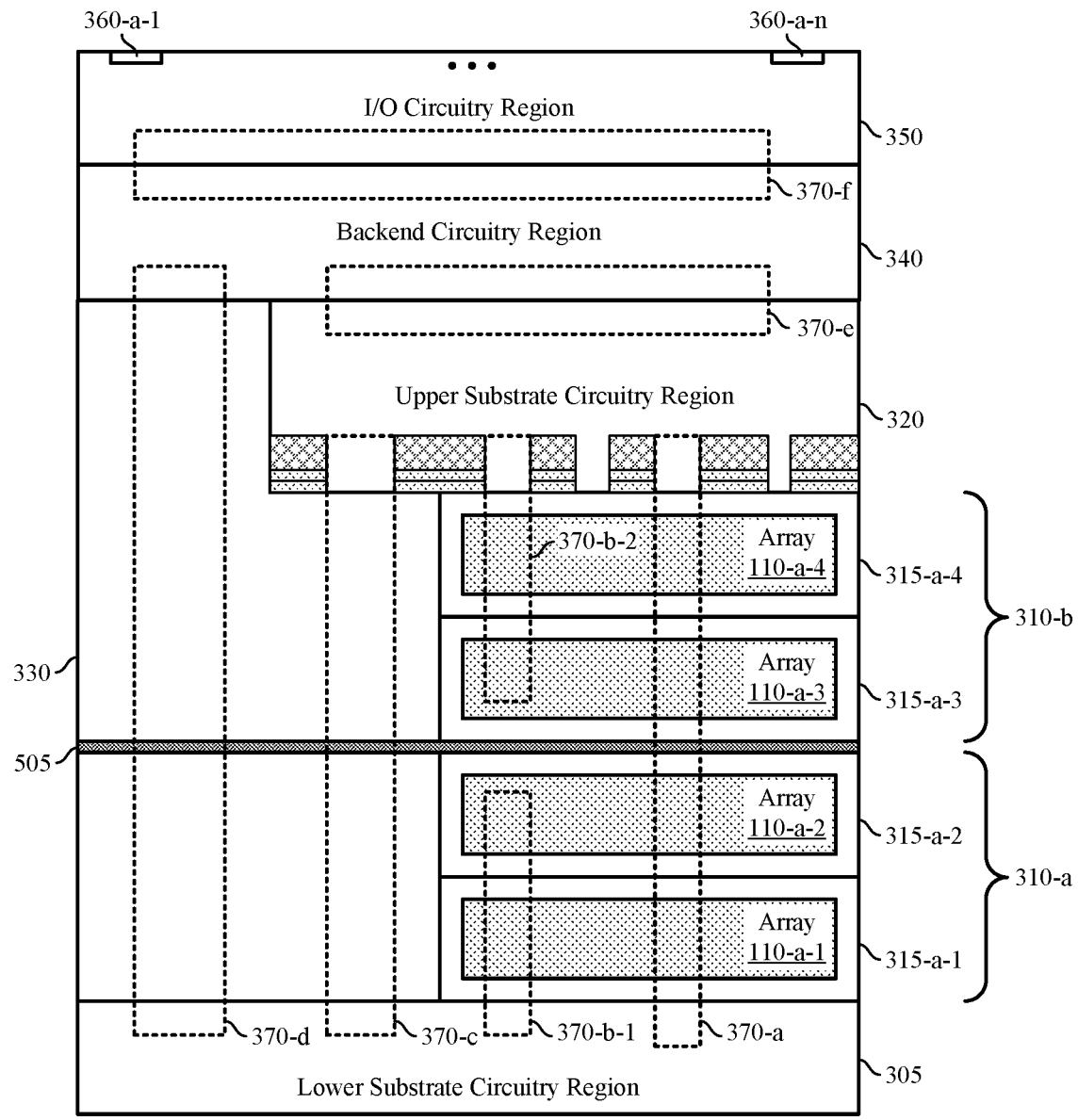

FIG. 8 illustrates an example of the memory device 100-*a* after a fifth set of manufacturing operations, including the formation of the upper substrate circuitry region 320, the backend circuitry region 340, and the I/O circuitry region 350.

Forming the upper substrate circuitry region 320 may include forming various circuitry for operating or accessing at least the decks 315-*a* of the set 310-*b*, which may include portions of a row component 125, a column component 135, or a sense component 150, among other components or circuitry. In some examples, forming the upper substrate circuitry region 320 may include forming some components or circuitry for operating each of the decks 315-*a* of the sets 310-*a* and 310-*b*, such as pad logic or other circuitry that may be common to or applicable to all of the decks 315-*a*-1 through 315-*a*-4. Forming the upper substrate circuitry region 320 may include doping portions of a substrate 220 (e.g., a second substrate, substrate portions 715) to form an upper set of transistors, which may include forming transistor structures 200 described with reference to FIG. 2. In some examples, at least some of such transistors may be arranged in a CMOS configuration. In some examples, an additional metallization layer may be formed over the transistors formed using the substrate portions 715, which may support denser interconnection routing above such transistors.

In some examples, forming the upper substrate circuitry region 320 may include forming interconnections with the memory arrays 110-*a*-1 through 110-*a*-4, with the lower substrate circuitry region 305, or various combinations thereof, which may include aspects of completing the interconnection regions 370-*a*, 370-*b*-2, or 370-*c*, or a combination thereof which may include various additive or subtractive operations performed during the formation of the upper substrate circuitry region 320. For example, completing circuitry of the interconnection region 370-*b*-2 (e.g., a second digit line socket region) may include forming TSVs coupled with digit lines of the memory arrays 110-*a*-3 and 110-*a*-4 (e.g., through a void 710). Further, completing circuitry of the interconnection region 370-*a* (e.g., a word line socket region) may include forming TSVs coupled with word lines 120 of at least the memory arrays 110-*a*-3 and 110-*a*-3 or, in some examples, with word lines 120 of all of the memory arrays 110-*a*-1 through 110-*a*-4, or with the circuitry of the lower substrate circuitry region 305, or both. In some examples, completing circuitry of the interconnection region 370-*c* may include forming TSVs coupled with circuitry of the lower substrate circuitry region 305. In some examples, aspects of completing the interconnection regions 370-*a*, 370-*b*-2, and 370-*c* may include concurrent operations, including one or more additive or subtractive operations for forming TSVs in two or more such regions.

The fifth set of operations may also include various operations for forming the backend circuitry region 340 and I/O circuitry region, which may include completing formation of the interconnection region 370-*a*, forming the interconnection regions 370-*e* and 370-*f*, and forming the pads 360-*a*-1 through 360-*a*-*n*. Forming the backend circuitry region 340 and the I/O circuitry region 350 may include forming various interconnecting conductors (e.g., copper interconnects, pads for packaging) for supporting communication of power, voltage, or signaling related to the operation of the memory arrays 110-*a*. In some examples, the operations may further include coating or encapsulating the memory device 100-*a* in a dielectric or other isolating material, such as a plastic or resin material, which may be formed such that the pads 360-*a*-1 through 360-*a*-*n* are exposed and operable for coupling with a host device.

Figure 9:
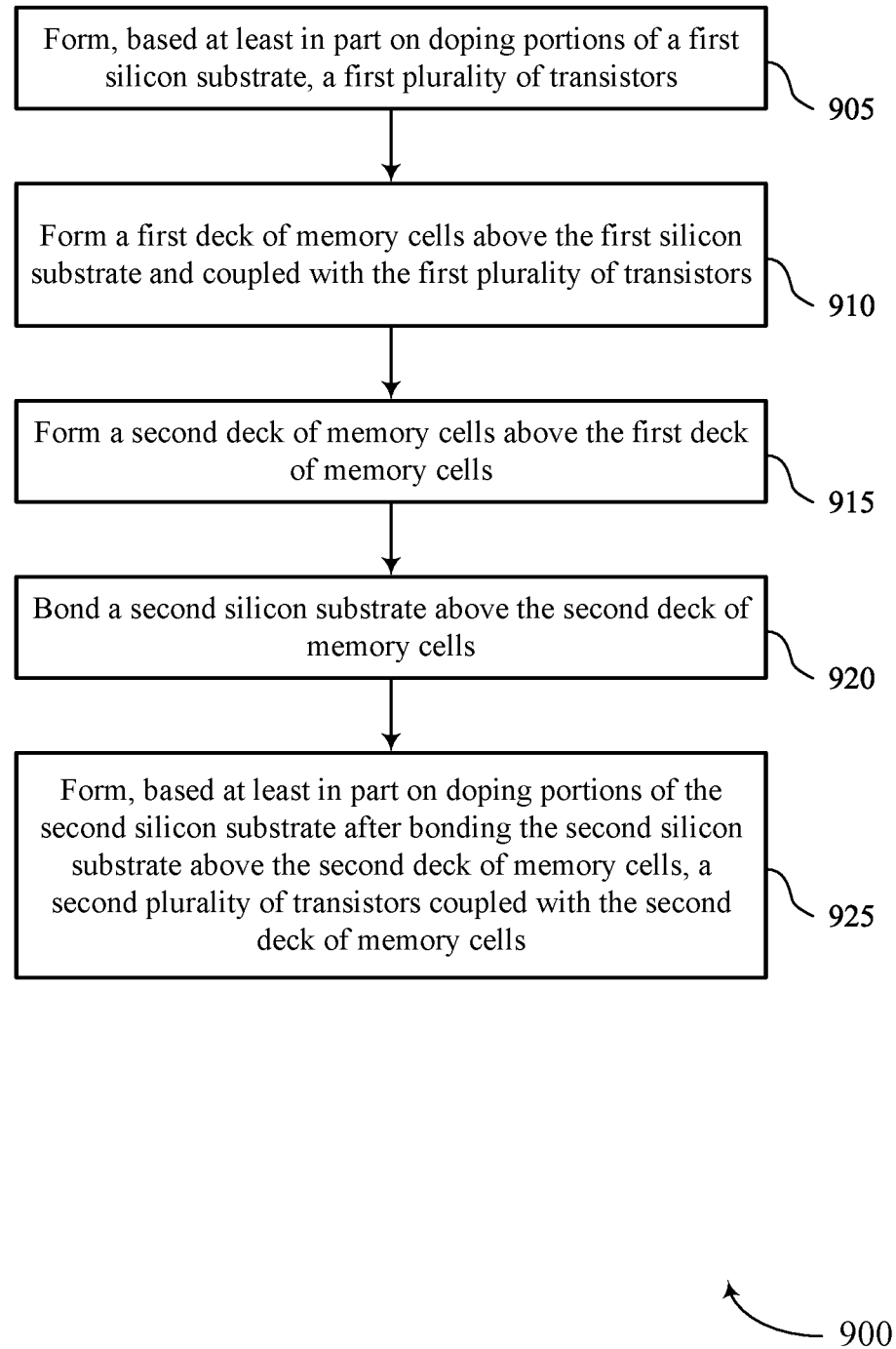
FIGS. 9 and 10 show flowcharts illustrating methods that support transistor configurations for multi-deck memory devices in accordance with examples as disclosed herein.

FIG. 9 shows a flowchart illustrating a method 900 that supports transistor configurations for multi-deck memory devices in accordance with examples as disclosed herein. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, the one or more controllers may perform aspects of the described functions using special-purpose hardware.

At 905, the method may include forming, based at least in part on doping portions of a first silicon substrate, a first plurality of transistors (e.g., of a lower substrate circuitry region 305). The operations of 905 may be performed in accordance with examples and techniques as disclosed herein, including one or more aspects described with reference to FIGS. 1 through 4.

At 910, the method may include forming a first deck of memory cells (e.g., a lower deck 315-*a*) above the first silicon substrate and coupled with the first plurality of transistors (e.g., via an interconnection region 370-*a*, via an interconnection region 370-*b*-1). The operations of 910 may be performed in accordance with examples and techniques as disclosed herein, including one or more aspects described with reference to FIGS. 1 through 4.

At 915, the method may include forming a second deck of memory cells (e.g., an upper deck 315-*a*) above the first deck of memory cells. The operations of 915 may be performed in accordance with examples and techniques as disclosed herein, including one or more aspects described with reference to FIGS. 1 through 3 and 5.

At 920, the method may include bonding a second silicon substrate (e.g., a material stack 605, a silicon layer 620) above the second deck of memory cells. The operations of 920 may be performed in accordance with examples and techniques as disclosed herein, including one or more aspects described with reference to FIGS. 1 through 3, 6A, and 6B.

At 925, the method may include forming, based at least in part on doping portions of the second silicon substrate after bonding the second silicon substrate above the second deck of memory cells, a second plurality of transistors (e.g., of an upper substrate circuitry region 320) coupled with the second deck of memory cells. The operations of 925 may be performed in accordance with examples and techniques as disclosed herein, including one or more aspects described with reference to FIGS. 1 through 3 and 6A through 8.

In some examples, an apparatus as described herein may be manufactured (e.g., fabricated) according to a method or methods, such as the method 900. A system for manufacturing the apparatus may include, features, circuitry, logic, means, or instructions (e.g., a non-transitory computer-readable medium storing instructions executable by a processor) for forming, based at least in part on doping portions of a first silicon substrate, a first plurality of transistors, forming a first deck of memory cells above the first silicon substrate and coupled with the first plurality of transistors, forming a second deck of memory cells above the first deck of memory cells, bonding a second silicon substrate above the second deck of memory cells, and forming, based at least in part on doping portions of the second silicon substrate after bonding the second silicon substrate above the second deck of memory cells, a second plurality of transistors coupled with the second deck of memory cells.

Some examples of the method 900 and the system for manufacturing described herein may further include operations, features, circuitry, logic, means, or instructions for etching through the second silicon substrate to form a plurality of second silicon substrate portions (e.g., substrate portions 715) and forming the second plurality of transistors based at least in part on doping the second silicon substrate portions.

Some examples of the method 900 and the system for manufacturing described herein may further include operations, features, circuitry, logic, means, or instructions for registering an orientation of one or more operations after the etching based at least in part on registration features located below the second silicon substrate and aligned between the second silicon substrate portions (e.g., aligned with one or more voids 710).

In some examples of the method 900 and the system for manufacturing described herein, forming the first deck of memory cells may include operations, features, circuitry, logic, means, or instructions for forming a stack of decks of memory cells (e.g., of a set 310-a) above the first silicon substrate, the stack of decks of memory cells including the first deck of memory cells and coupled with the first plurality of transistors.

Some examples of the method 900 and the system for manufacturing described herein may further include operations, features, circuitry, logic, means, or instructions for forming a metal layer (e.g., a metal layer 505) above the stack of decks of memory cells, the second deck of memory cells formed above the metal layer.

In some examples of the method 900 and the system for manufacturing described herein, forming the second deck of memory cells may include operations, features, circuitry, logic, means, or instructions for forming a stack of decks of memory cells (e.g., of a set 310-b) above the first deck of memory cells, the stack of decks of memory cells including the second deck of memory cells and coupled with the second plurality of transistors.

Some examples of the method 900 and the system for manufacturing described herein may further include operations, features, circuitry, logic, means, or instructions for forming, before bonding the second silicon substrate, a first oxide material (e.g., of an oxide layer 650) above the second deck of memory cells and forming, before bonding the second silicon substrate, a second oxide material (e.g., of an oxide layer 625) in contact with the second silicon substrate, where bonding the second silicon substrate above the second deck of memory cells includes bonding the first oxide material to the second oxide material.

Some examples of the method 900 and the system for manufacturing described herein may further include operations, features, circuitry, logic, means, or instructions for forming, above the second silicon substrate, I/O circuitry (e.g., of an I/O circuitry region 350, of a backend circuitry region 340) coupled with the second plurality of transistors (e.g., via an interconnection region 370-e).

In some examples of the method 900 and the system for manufacturing described herein, the I/O circuitry may be operable for communication with the first deck of memory cells (e.g., via an interconnection region 370-f, or an interconnection region 370-d, or an interconnection region 370-c, among other interconnection regions 370) and the second deck of memory cells (e.g., via an interconnection region 370-f, or an interconnection region 370-e, among other interconnection regions 370).

Some examples of the method 900 and the system for manufacturing described herein may further include operations, features, circuitry, logic, means, or instructions for forming, above the silicon substrate and after forming the second plurality of transistors, backend circuitry (e.g., of a backend circuitry region 340) coupled with the second plurality of transistors (e.g., via an interconnection region 370-e).

Some examples of the method 900 and the system for manufacturing described herein may further include operations, features, circuitry, logic, means, or instructions for forming, above the first silicon substrate, a plurality of interconnects (e.g., of an interconnection region 370-d, an interconnection region 370-e, or a combination thereof), where the plurality of interconnects couples the backend circuitry with the first plurality of transistors and the second plurality of transistors.

Some examples of the method 900 and the system for manufacturing described herein may further include operations, features, circuitry, logic, means, or instructions for forming, on the second silicon substrate, a metal layer (e.g., over substrate-based transistors of an upper substrate circuitry region 320).

Figure 10:
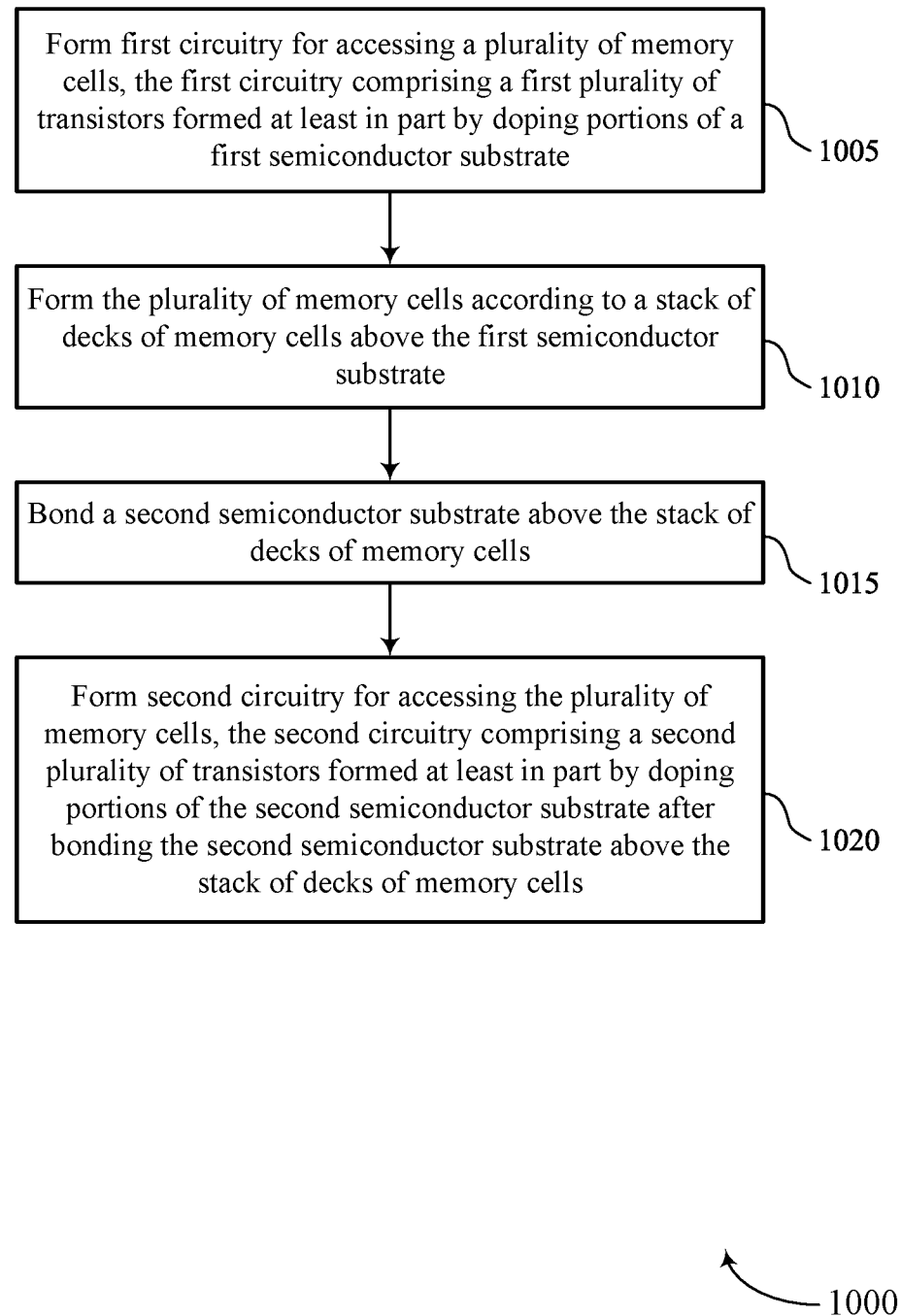

FIG. 10 shows a flowchart illustrating a method 1000 that supports transistor configurations for multi-deck memory devices in accordance with examples as disclosed herein. The operations of method 1000 may be implemented by a manufacturing system or one or more controllers associated with a manufacturing system. In some examples, one or more controllers may execute a set of instructions to control one or more functional elements of the manufacturing system to perform the described functions. Additionally or alternatively, the one or more controllers may perform aspects of the described functions using special-purpose hardware.

At 1005, the method may include forming first circuitry (e.g., of a lower substrate circuitry region 305) for accessing a plurality of memory cells, the first circuitry including a first plurality of transistors formed at least in part by doping portions of a first semiconductor substrate. The operations of 1005 may be performed in accordance with examples and techniques as disclosed herein, including one or more aspects described with reference to FIGS. 1 through 4.

At 1010, the method may include forming the plurality of memory cells according to a stack of decks of memory cells (e.g., a stack of decks 315-a) above the first semiconductor substrate. The operations of 1010 may be performed in accordance with examples and techniques as disclosed herein, including one or more aspects described with reference to FIGS. 1 through 5.

At 1015, the method may include bonding a second semiconductor substrate (e.g., a substrate 220, a silicon layer 620) above the stack of decks of memory cells. The operations of 1015 may be performed in accordance with examples and techniques as disclosed herein, including one or more aspects described with reference to FIGS. 1 through 3, 6A, and 6B.

At 1020, the method may include forming second circuitry (e.g., of an upper substrate circuitry region 320) for accessing the plurality of memory cells, the second circuitry including a second plurality of transistors formed at least in part by doping portions of the second semiconductor substrate after bonding the second semiconductor substrate above the stack of decks of memory cells. The operations of 1020 may be performed in accordance with examples and techniques as disclosed herein, including one or more aspects described with reference to FIGS. 1 through 3 and 6A through 8.

In some examples, an apparatus as described herein may be manufactured (e.g., fabricated) according to a method or methods, such as the method 1000. A system for manufacturing the apparatus may include, features, circuitry, logic, means, or instructions (e.g., a non-transitory computer-readable medium storing instructions executable by a processor) for forming first circuitry for accessing a plurality of memory cells, the first circuitry including a first plurality of transistors formed at least in part by doping portions of a first semiconductor substrate, forming the plurality of memory cells according to a stack of decks of memory cells above the first semiconductor substrate, bonding a second semiconductor substrate above the stack of decks of memory cells, and forming second circuitry for accessing the plurality of memory cells, the second circuitry including a second plurality of transistors formed at least in part by doping portions of the second semiconductor substrate after bonding the second semiconductor substrate above the stack of decks of memory cells.

Some examples of the method 1000 and the system for manufacturing described herein may further include operations, features, circuitry, logic, means, or instructions for etching through portions of the second semiconductor substrate to form a plurality of voids (e.g., voids 710) to the stack of decks of memory cells, where the second plurality of transistors may be formed on remaining portions of the second semiconductor substrate (e.g., substrate portions 715).

Some examples of the method 1000 and the system for manufacturing described herein may further include operations, features, circuitry, logic, means, or instructions for forming a first oxide material (e.g., of an oxide layer 650) above atop deck of memory cells of the stack of decks of memory cells and forming a second oxide material (e.g., of an oxide layer 625) in contact with the second semiconductor substrate, where bonding the second semiconductor substrate above the stack of decks of memory cells includes bonding the first oxide material to the second oxide material.

Some examples of the method 1000 and the system for manufacturing described herein may further include operations, features, circuitry, logic, means, or instructions for forming, above and coupled with the second circuitry, backend circuitry (e.g., of a backend circuitry region 340) associated with the plurality of memory cells and forming, above the backend circuitry, I/O circuitry (e.g., of an I/O circuitry region 350) associated with the plurality of memory cells that is coupled with the first circuitry and the second circuitry.

Some examples of the method 1000 and the system for manufacturing described herein may further include operations, features, circuitry, logic, means, or instructions for forming, above the first semiconductor substrate, interconnect circuitry associated with the plurality of memory cells that couples the backend circuitry to the first circuitry (e.g., via an interconnection region 370-d) and the second circuitry (e.g., via an interconnection region 370-e).

In some examples of the method 1000 and the system for manufacturing described herein, the first plurality of transistors, or the second plurality of transistors, or both include a CMOS configuration.

In some examples of the method 1000 and the system for manufacturing described herein, the first circuitry includes circuitry for performing sense operations on a first subset of decks of the stack of decks, circuitry for performing access operations on the first subset of decks, circuitry for performing decoding operations on the first subset of decks, or circuitry for performing I/O operations on the first subset of decks, or a combination thereof and the second circuitry includes circuitry for performing sense operations on a second subset of decks of the stack of decks, circuitry for performing access operations on the second subset of decks, circuitry for performing decoding operations on the second subset of decks, or circuitry for performing I/O operations on the second subset of decks, or a combination thereof.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a first silicon substrate (e.g., a substrate 220), a first plurality of transistors (e.g., of a lower substrate circuitry region 305) formed at least in part by doped portions of the first silicon substrate, a first deck of memory cells (e.g., a lower deck 315-a) above and coupled with the first plurality of transistors (e.g., via an interconnection region 370-a or an interconnection region 370-b-1), a second deck of memory cells (e.g., an upper deck 315-a) above the first deck of memory cells, a second silicon substrate above the second deck of memory cells, and a second plurality of transistors (e.g., of an upper substrate circuitry region 320) formed at least in part by doped portions of the second silicon substrate and coupled with the second deck of memory cells (e.g., via an interconnection region 370-a, via an interconnection region 370-b-2).

In some examples of the apparatus, the first silicon substrate and the second silicon substrate each include crystalline silicon.

In some examples of the apparatus, the second silicon substrate may include an oxide layer (e.g., of an oxide layer 625) over the crystalline silicon of the second silicon substrate, and the second silicon substrate may be bonded over the second deck of memory cells based at least in part on the oxide layer.

In some examples, the apparatus may include a first stack of decks of memory cells (e.g., of a set 310-a) above the first silicon substrate and coupled with the first plurality of transistors, the first stack of decks of memory cells including the first deck of memory cells. In some examples, the apparatus may include a second stack of decks of memory cells (e.g., of a set 310-b) above the first silicon substrate and coupled with the second plurality of transistors, the second stack of decks of memory cells including the second deck of memory cells.

In some examples, the apparatus may include I/O circuitry (e.g., of an I/O circuitry region 350, of a backend circuitry region 340) above the second plurality of transistors and operable for communication with the first deck of memory cells and the second deck of memory cells.

In some examples, the apparatus may include a plurality of interconnects (e.g., of an interconnection region 370-c, of an interconnection region 370-a) between the first plurality of transistors and the second plurality of transistors, where the plurality of interconnects couple the I/O circuitry with the first plurality of transistors and the second plurality of transistors.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other while the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a first silicon substrate;
a first plurality of transistors formed at least in part by doped portions of the first silicon substrate;
a first deck of memory cells above and coupled with the first plurality of transistors;
a second deck of memory cells above the first deck of memory cells;
a second silicon substrate above the second deck of memory cells;
a second plurality of transistors formed at least in part by doped portions of the second silicon substrate and coupled with the second deck of memory cells;
a plurality of first interconnects, wherein each first interconnect of the plurality of first interconnects couples one or more first access lines of the first deck of memory cells and the second deck of memory cells with one or more transistors of each of the first plurality of transistors and the second plurality of transistors; and
a plurality of second interconnects, wherein a first subset of the plurality of second interconnects couples one or more second access lines of the first deck of memory cells with the first plurality of transistors and a second subset of the plurality of second interconnects couples one or more second access lines of the second deck of memory cells with the second plurality of transistors.

2. The apparatus of claim 1, wherein the first silicon substrate and the second silicon substrate each comprise crystalline silicon.

3. The apparatus of claim 2, wherein the second silicon substrate comprises an oxide layer over the crystalline silicon of the second silicon substrate, the second silicon substrate bonded over the second deck of memory cells based at least in part on the oxide layer.

4. The apparatus of claim 1, further comprising:
a first stack of decks of memory cells above the first silicon substrate and coupled with the first plurality of transistors, the first stack of decks of memory cells comprising the first deck of memory cells; and
a second stack of decks of memory cells above the first silicon substrate and coupled with the second plurality of transistors, the second stack of decks of memory cells comprising the second deck of memory cells.

5. The apparatus of claim 1, further comprising:
input/output circuitry above the second plurality of transistors and operable for communication with the first deck of memory cells and the second deck of memory cells.

6. The apparatus of claim 5, further comprising:
a plurality of third interconnects between the first plurality of transistors and the second plurality of transistors, wherein the plurality of third interconnects couple the input/output circuitry with the first plurality of transistors and the second plurality of transistors.

7. The apparatus of claim 1, wherein the first plurality of transistors, or the second plurality of transistors, or both comprise a complementary metal-oxide-semiconductor (CMOS) configuration.

8. A memory system formed by a process comprising:
forming a first silicon substrate;
forming a first plurality of transistors formed at least in part by doped portions of the first silicon substrate;
forming a first deck of memory cells above and coupled with the first plurality of transistors;
forming a second deck of memory cells above the first deck of memory cells;
bonding a second silicon substrate above the second deck of memory cells;
forming a second plurality of transistors formed at least in part by doped portions of the second silicon substrate and coupled with the second deck of memory cells;
a plurality of first interconnects, wherein each first interconnect of the plurality of first interconnects couples one or more first access lines of the first deck of memory cells and the second deck of memory cells with one or more transistors of each of the first plurality of transistors and the second plurality of transistors; and a plurality of second interconnects, wherein a first subset of the plurality of second interconnects couples one or more second access lines of the first deck of memory cells with the first plurality of transistors and a second subset of the plurality of second interconnects couples one or more second access lines of the second deck of memory cells with the second plurality of transistors.

9. The memory system of claim 8, wherein the first silicon substrate and the second silicon substrate each comprise crystalline silicon.

10. The memory system of claim 9, wherein the second silicon substrate comprises an oxide layer over the crystalline silicon of the second silicon substrate, the second silicon substrate bonded over the second deck of memory cells based at least in part on the oxide layer.

11. The memory system of claim 8, wherein the process further comprises:

forming a first stack of decks of memory cells above the first silicon substrate and coupled with the first plurality of transistors, the first stack of decks of memory cells comprising the first deck of memory cells; and forming a second stack of decks of memory cells above the first silicon substrate and coupled with the second plurality of transistors, the second stack of decks of memory cells comprising the second deck of memory cells.

12. The memory system of claim 8, wherein the process further comprises:

forming input/output circuitry above the second plurality of transistors and operable for communication with the first deck of memory cells and the second deck of memory cells.

13. The memory system of claim 12, wherein the process further comprises:

forming a plurality of third interconnects between the first plurality of transistors and the second plurality of transistors, wherein the plurality of third interconnects couple the input/output circuitry with the first plurality of transistors and the second plurality of transistors.

14. The memory system of claim 8, wherein the first plurality of transistors, or the second plurality of transistors, or both comprise a complementary metal-oxide-semiconductor (CMOS) configuration.

* * * * *